United States Patent
Sugimoto et al.

(10) Patent No.: US 6,546,525 B2
(45) Date of Patent: Apr. 8, 2003

(54) LSI TESTING APPARATUS

(75) Inventors: Masaru Sugimoto, Tokyo (JP);
Yasuhide Nakase, Hyogo (JP);
Teruhiko Funakura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 123 days.

(21) Appl. No.: 09/761,179

(22) Filed: Jan. 18, 2001

(65) Prior Publication Data

US 2002/0007479 A1 Jan. 17, 2002

(30) Foreign Application Priority Data

Jul. 12, 2000 (JP) .................................. 2000-211907

(51) Int. Cl.[7] .............................................. G06F 17/50
(52) U.S. Cl. ................................................. 716/4; 716/1
(58) Field of Search ........................................ 716/1–18

(56) References Cited

U.S. PATENT DOCUMENTS

| | | | | |
|---|---|---|---|---|
| 4,381,552 A | * | 4/1983 | Nocilini et al. | 365/227 |
| 4,626,704 A | * | 12/1986 | Takata et al. | 323/299 |
| 4,691,123 A | * | 9/1987 | Hashimoto | 323/311 |
| 5,167,024 A | * | 11/1992 | Smith et al. | 360/75 |
| 5,412,599 A | * | 5/1995 | Daniele et al. | 326/112 |
| 6,088,807 A | * | 7/2000 | Maher et al. | 713/322 |
| 6,188,293 B1 | * | 2/2001 | Miyagi et al. | 331/185 |
| 6,281,698 B1 | * | 8/2001 | Sugimoto et al. | 324/765 |
| 6,331,770 B1 | * | 12/2001 | Sugamori | 324/158.1 |

FOREIGN PATENT DOCUMENTS

JP          406046468 A    *   2/1994   ............ H04Q/3/52

* cited by examiner

*Primary Examiner*—Vuthe Siek
*Assistant Examiner*—Sun James Lin
(74) *Attorney, Agent, or Firm*—McDermott, Will & Emery

(57) ABSTRACT

An LSI testing apparatus of the invention comprises: a plurality of pins P1, P2, . . . PN; function units 10, 11 and 12 which supply the pins with LSI testing signals, which have functions for making judgments on tests, and which are furnished for each of the pins; and clock mask function units 15A and 15B furnished on the input side of each function unit. Upon testing, any unused pin and function are detected so as to mask the clock mask function unit corresponding to the detected pin and function, whereby power dissipation is reduced in terms of unused pins and functions.

20 Claims, 9 Drawing Sheets

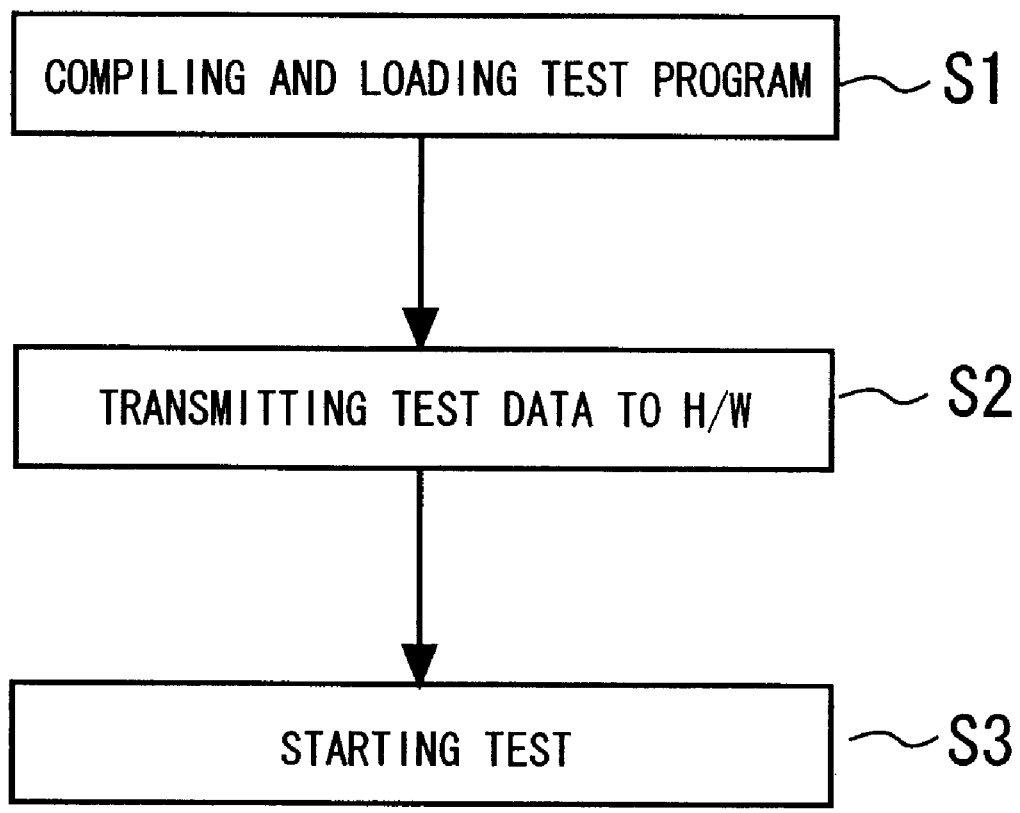

LSI TESTING APPARATUS

BACKGROUND OF THE INVENTION

1. Field of the Invention

The present invention relates to an LSI testing apparatus and, more particularly, to an LSI testing apparatus and testing method adapted to reduce power dissipation.

2. Description of the Background Art

Conventional LSI testing apparatuses are provided with test programs corresponding to specific LSIs and are controlled thereby in carrying out tests on such LSIs. FIG. 9 is a flowchart of steps in which a conventional LSI testing apparatus typically operates.

Immediately after power-up, the conventional LSI testing apparatus becomes capable of executing all its functions using all its pins. Illustratively, as shown in FIG. 9, a test program is compiled and loaded in step S1. After test data are set to the hardware in step S2, tests are carried out in step S3.

In that flow of steps, when some pins or functions of the LSI testing apparatus are deemed unnecessary for the LSI test in question, those portions of apparatus hardware which are not relevant to the LSI test are nevertheless left activated.

Structured as outlined above, conventional LSI testing apparatuses have had part of their hardware dissipating more power than is actually needed. This has led to elevated running costs of the LSI testing apparatuses regardless of the LSIs to be tested. Where varieties of LSIs are to be tested at a semiconductor factory, the extra running costs tend to make LSI test costs unreasonably high.

SUMMARY OF THE INVENTION

The present invention has been made in view of the above circumstances and provides an LSI testing apparatus whereby any pins and functions not used in testing a specific LSI are detected so as to save power in terms of such unused pins and functions and whereby any currently inactive pins and functions to be activated for testing a different LSI are also detected so that aging of newly tested LSI will be completed in a short time.

The above objects of the present invention are achieved by an LSI testing apparatus described below. The apparatus includes a plurality of pins as well as function units which supply the pins with LSI testing signals, which have functions for making judgments on tests, and which are furnished for each of the pins. Any unused pin and function are detected so as to stop the function unit corresponding to the detected pin and function. According to the apparatus, power dissipation is reduced in terms of unused pins and functions.

The above objects of the present invention are achieved by an LSI testing apparatus described below. The apparatus includes a plurality of pins as well as function units which supply the pins with LSI testing signals, which have functions for making judgments on tests, and which are furnished for each of the pins. Upon testing, any pin and function having made an unused to used state transition are detected so as to warm up the function units corresponding to the detected pin and function.

Other objects and further features of the present invention will be apparent from the following detailed description when read in conjunction with the accompanying drawings.

BRIEF DESCRIPTION OF THE DRAWINGS

FIG. 9 is a flowchart of steps performed by a conventional LSI testing apparatus.

DESCRIPTION OF THE PREFERRED EMBODIMENTS

First Embodiment

A first embodiment of this invent ion will now be described with reference to some of the accompanying drawings.

Figure 1:
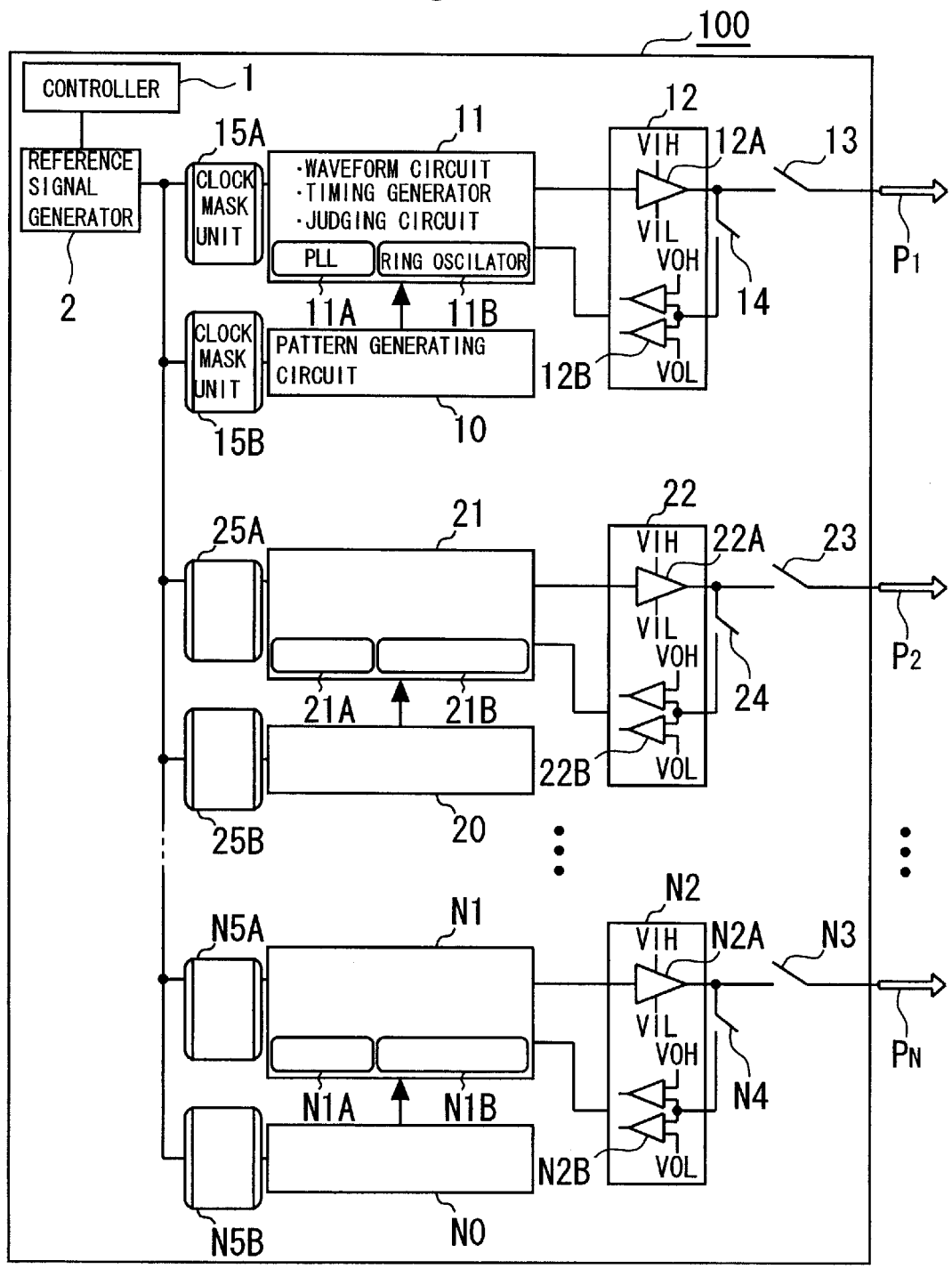
FIG. 1 is a block diagram of a first embodiment of this invention.
Figure 2:
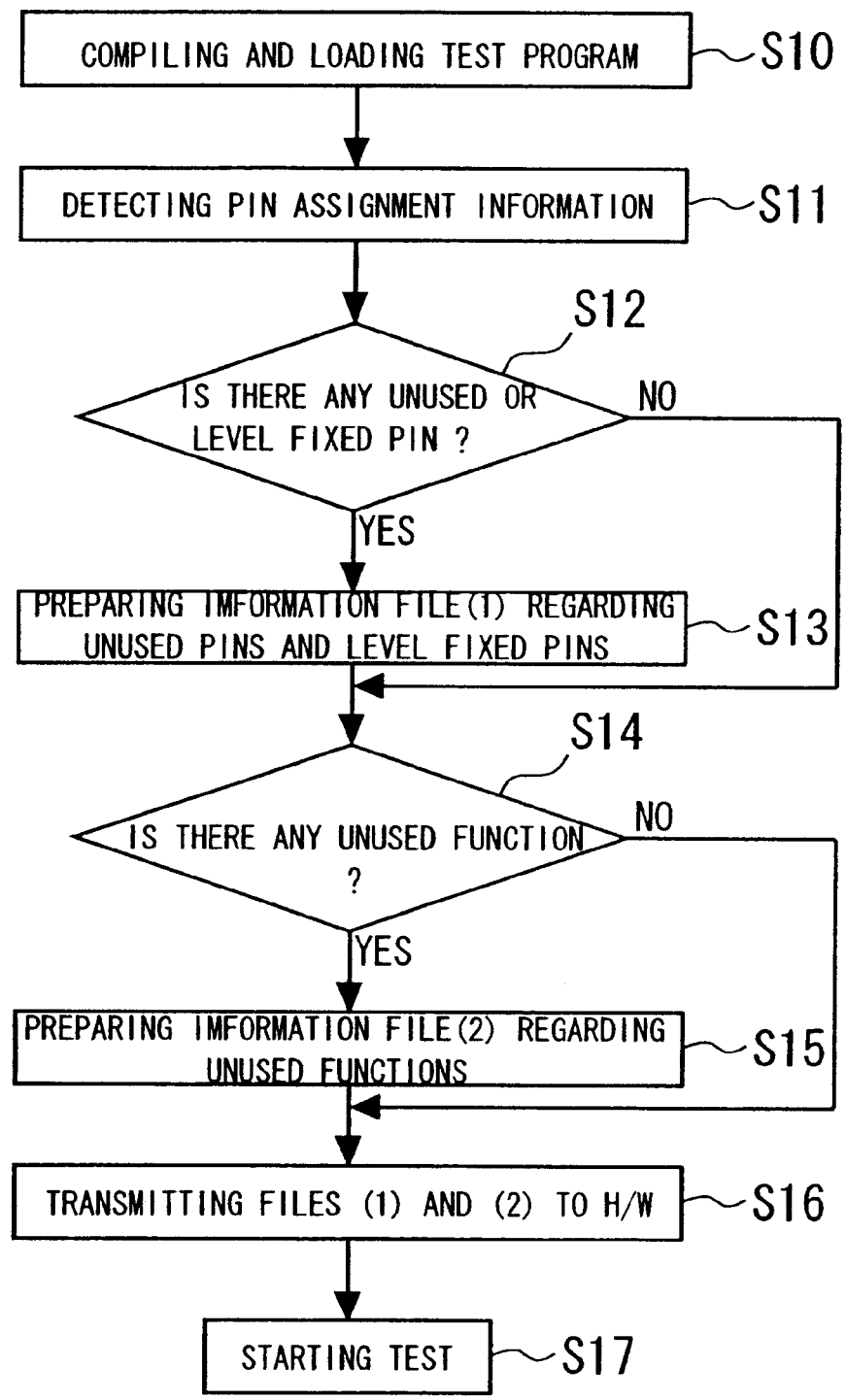
FIG. 2 is a flowchart of steps performed by the first embodiment.

FIG. 1 is a block diagram of the first embodiment of this invention. FIG. 2 is a flowchart of steps performed by the first embodiment. In FIG. 1, reference numeral 100 represents an LSI testing apparatus, and P1, P2, . . . PN denote a plurality of pins furnished on the LSI testing apparatus. Reference numeral 1 stands for a controller of the LSI testing apparatus; 2 for a reference signal generator that generates a reference signal within the LSI testing apparatus; and 10 for a pattern generating circuit which is made of CMOSs and which, based on the signal from the reference signal generator 2, generates a pin destination output pattern and a judgment pattern with regard to the first pin P1 of the LSI testing apparatus. Reference numeral 11 represents a main circuit comprising a timing signal generating circuit, a waveform generating circuit and a judging circuit. The timing signal generating circuit generates a timing signal based on the signal from the reference signal generator 2 as well as on pattern data from the pattern generating circuit 10. A PLL circuit 11A and a ring oscillating circuit 11B, each composed of CMOSs, form the component circuits which in turn make up the main circuit 11.

Reference numeral 12 represents a pin electronics circuit which is connected interposingly between the main circuit 11 and the first pin P1 and which comprises a driver circuit 12A and a comparator circuit 12B of a known type each.

Reference numeral 13 stands for a relay that makes and breaks a circuit between the first pin P1 and the pin electronics circuit 12, and numeral 14 represents a relay that makes and breaks a circuit between the first pin P1 and the comparator circuit 12B. Reference numerals 15A and 15B are clock mask function units that are key components of the first embodiment. The clock mask function units 15A and 15B are connected to the reference signal input sides of the main circuit 11 and pattern generating circuit 10 respectively. Located where they are, the clock mask function units 15A and 15B mask the reference signal coming from the reference signal generator 2 to stop the clock to the main circuit 11 and the pattern generating circuit 10, and thereby deactivating the operation of the PLL circuit 11A and the ring oscillation circuit 11B in the main circuit 11. The pattern generating circuit 10, main circuit 11, and pin electronics circuit 12 make up a function unit regarding the first pin P1.

Reference numerals 20 and N0 each represent a pattern generating circuit having the same structure as that of the pattern generating circuit 10; numerals 21 and N1 each denote a main circuit having the same structure as that of the main circuit 11; numerals 22 and N2 each stand for a pin electronics circuit having the same structure as that of the pin electronics circuit 12; numerals 23, N3, 24 and N4 each indicate a relay structured in the same manner as the relays 13 and 14; and numerals 25A, 25B, N5A and N5B each denote a clock mask function unit structured the same as the clock mask function units 15A and 15B. The pattern generating circuit 20, main circuit 21, and pin electronics circuit 22 constitute a function unit regarding the second pin P2; the pattern generating circuit N0, main circuit N1, and pin electronics circuit N2 make up a function unit with respect to the N-th pin PN.

How the first embodiment works will now be described with reference to the flowchart of FIG. 2.

In step S10, a test program is compiled and loaded. In step S11, pin assignment information is detected. In step S12, a check is made for unused or level-fixed pins.

If any unused or level-fixed pins are judged to exist, step S13 is reached in which information about the pins is filed. In step S14, a check is made for unused functions. If any unused functions are judged to exist, step S15 is reached in which information about the unused functions is likewise filed. In step S16, an information is set based on the filed information to the clock mask function units 15A, 15B, 25A, 25B, . . . N5A and N5B prepared for every pin and every function of the LSI testing apparatus. Illustratively, if the first pin P1 is not used, the clock mask function units 15A and 15B corresponding to that pin are masked. This stops the clock to the pattern generating circuit 10 and main circuit 11, and deactivates the operation of the PLL circuit 11A and ring oscillating circuit 11B in the main circuit 11. Consequently, the rate of CMOSs in operation is reduced.

Fewer CMOSs in action translate into less power dissipation. Thus in step S17, an LSI test is carried out while a reduced level of power consumption is being maintained.

As a result, the LSI testing apparatus has its power dissipation lowered in units of unused pins and functions. Because the unused pins and functions are detected by a test program corresponding to a specific LSI type to be tested, power is optimally saved on each target LSI, whereby the running cost of the LSI testing apparatus is effectively lowered.

Second Embodiment

A second embodiment of this invent ion will now be described with reference to some of the accompanying drawings.

Figure 3:
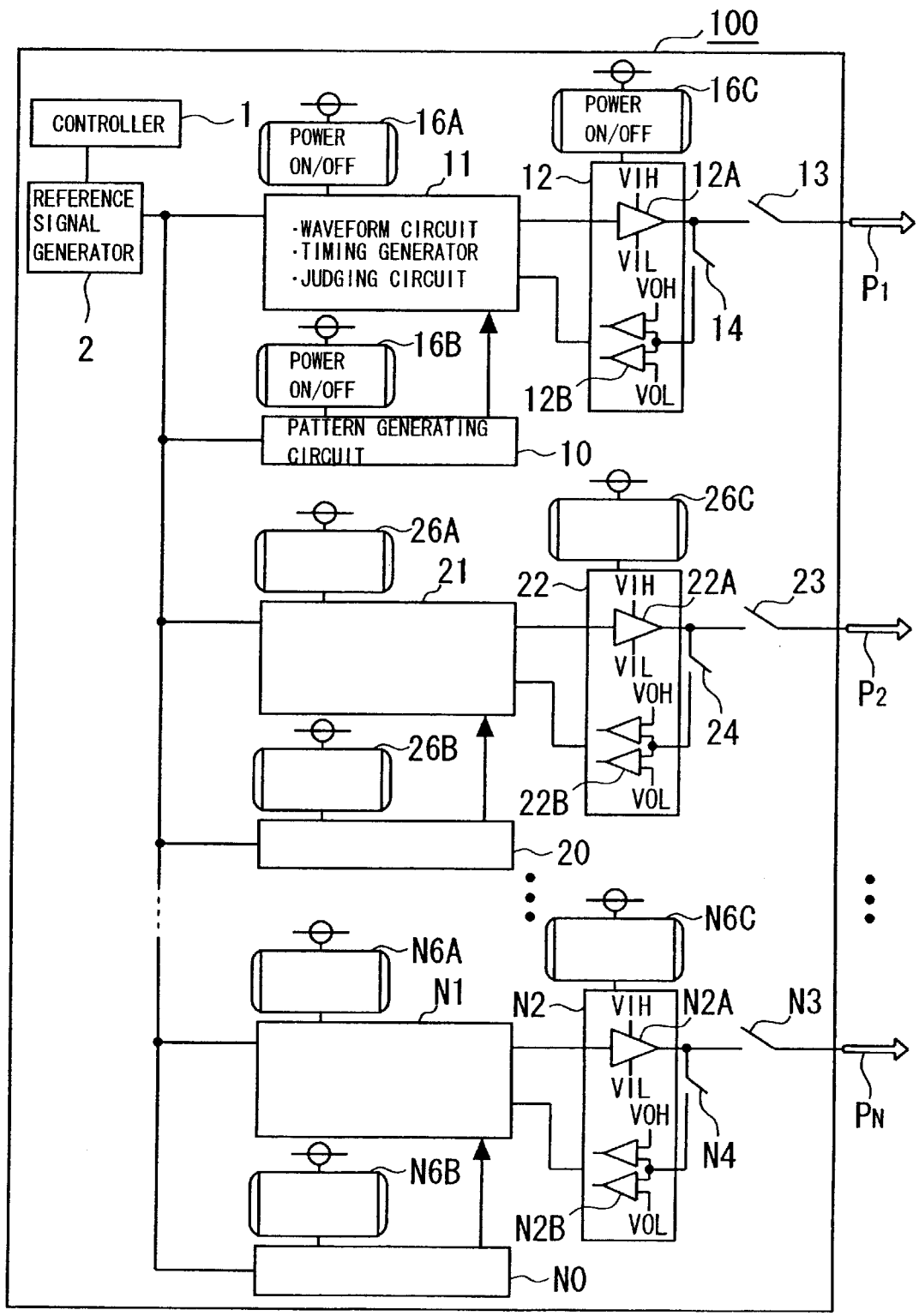
FIG. 3 is a block diagram of a second embodiment of the invention.

FIG. 3 is a block diagram of the second embodiment. In FIG. 3, the component parts having the same or corresponding functions as their counterparts in FIG. 1 are designated by like reference numerals, and their descriptions are omitted to avoid unnecessary repetition. The second embodiment differs from the embodiment in FIG. 1 in that the clock mask function units are removed from the input sides of the pattern generating circuits 10, 20 and N0 as well as the main circuits 11, 21 and N1 and that the pattern generating circuits, the main circuits, and the pin electronics circuits 12, 22 and N2 are each provided with a power-on/off circuit. More specifically, in FIG. 3, reference numeral 16A stands for a power-on/off circuit for the main circuit 11; 16B for a power-on/off circuit for the pattern generating circuit 10; and 16C for a power-on/off circuit for the pin electronics circuit 12. Each power-on/off circuit is designed to control application and removal of power to and from the corresponding circuit.

Reference numerals 26A, 26B and 26C represent power-on/off circuits for the main circuit 21, pattern generating circuit 20, and pin electronics circuit 22 with regard to the second pin P2. Reference numerals N6A, N6B and N6C denote power-on/off circuits for the main circuit N1, pattern generating circuit N0, and pin electronics circuit N2 with respect to the N-th pin PN. Each power-on/off circuit has the same structure as that of the above-mentioned circuits 16A, 16B and 16C.

How the second embodiment works will now be described. Basic operations of the second embodiment are the same as those of the first embodiment in the flowchart of FIG. 2 and thus will not be described further. The second embodiment differs from the first embodiment in step S16 where the information is set to the power-on/off circuits 16A through 16C, 26A through 26C, . . . N6A through N6C furnished to every pin and every function of the LSI testing apparatus, respectively. Illustratively, if the first pin P1 is not used, then the power-on/off circuits 16A, 16B and 16C for the main circuit 11, pattern generating circuit 10 and pin electronics circuit 12 regarding the pin P1 are turned off; if the second pin P2 has a fixed level, then the power-on/off circuit 26C for the pin electronics circuit 22 regarding the pin P2 remains on while the power-on/off circuits 26A and 26B for the main circuit 21 and pattern generating circuit 20 are turned off. In this manner, the second embodiment allows power to be turned on and off in units of pins and functions before having the target LSI tested in step S17. As a result, the LSI testing apparatus saves power in terms of unused pins and functions. Because the unused pins and functions are detected by a test program corresponding to a specific LSI type to be tested, power is optimally saved on each target LSI, whereby the running cost of the LSI testing apparatus is effectively lowered.

Third Embodiment

A third embodiment of this invention will now be described with reference to some of the accompanying drawings.

Figure 4:
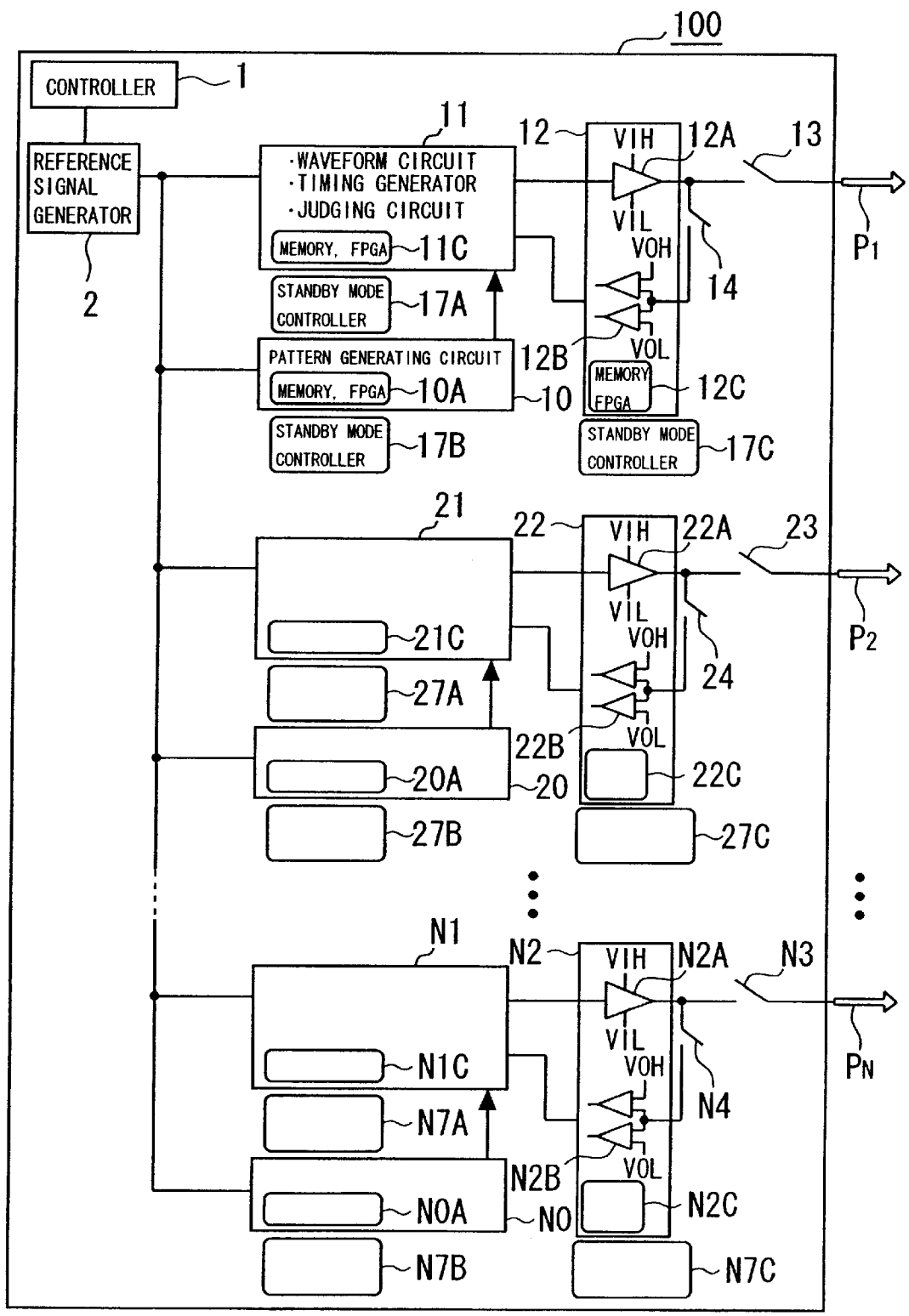
FIG. 4 is a block diagram of a third embodiment of the invention.

FIG. 4 is a block diagram of the third embodiment. In FIG. 4, the component parts having the same or corresponding functions as their counterparts in FIG. 1 are designated by like reference numerals, and their descriptions are omitted. The third embodiment differs from the first embodiment in FIG. 1 in that the clock mask function units are removed from the input sides of the pattern generating circuits 10, 20 and N0 as well as the main circuits 11, 21 and N1 and that the pattern generating circuits, the main circuits, and the pin electronics circuits 12, 22 and N2 are each provided with a standby mode control circuit. More specifically, in FIG. 4, reference numeral 17A stands for a standby mode control circuit attached to the main circuit 11 to control the standby mode of a memory and FPGA (field programmable gate array) 11C included in the main circuit 11. Reference numeral 17B denotes a standby mode control circuit attached to the pattern generating circuit 10 to control the standby mode of a memory and FPGA 10A included in the pattern generating circuit 10. Reference numeral 17C represents a standby mode control circuit attached to the pin electronics circuit 12 to control the standby mode of a memory and FPGA 12C included in the pin electronics circuit 12.

Reference numerals 27A, 27B and 27C denote standby mode control circuits attached respectively to the main circuit 21, pattern generating circuit 20, and pin electronics circuit 22 regarding the second pin P2. Reference numerals N7A, N7B and N7C stand for standby mode control circuits attached respectively to the main circuit N1, pattern generating circuit N0, and pin electronics circuit N2 with respect to the N-th pin PN. Each of these standby mode control circuits functions the same way as the standby mode control circuits furnished to the function units for the first pin P1.

How the third embodiment works will now be described. Basic operations of the third embodiment are the same as those of the first embodiment in the flowchart of FIG. 2 and thus will not be described further. The third embodiment differs from the first embodiment in step S16 where the filed information is set to the standby mode control circuits 17A through 17C, 27A through 27C, . . . N7A through N7C furnished in individually corresponding to the pins and functions of the LSI testing apparatus. Illustratively, if the first pin P1 is not used, then the standby mode control circuits 17A, 17B and 17C corresponding to the same bring into the standby mode those memories and FPGAs 11C, 10A and 12C which are included in the main circuit 11, pattern generating circuit 10 and pin electronics circuit 12 respectively. If the second pin P2 has a fixed level, then the standby mode control circuits 27A and 27B bring into the standby mode those memories and FPGAs 21C and 20A which are included in the main circuit 21 and pattern generating circuit 20 respectively while the standby mode control circuit 27C for the pin electronics circuit 22 regarding the pin P2 is functionally excluded.

In the manner described, the third embodiment permits control on the standby mode of such components as memories and FPGAs in units of pins and functions before getting the target LSI tested in step S17. As a result, the LSI testing apparatus saves power in terms of unused pins and functions.

Because the unused pins and functions are detected by a test program corresponding to a specific LSI type to be tested, power is optimally saved on each target LSI, whereby the running cost of the LSI testing apparatus is effectively lowered.

Fourth Embodiment

A fourth embodiment of this invent ion will now be described with reference to some of the accompanying drawings.

Figure 5:
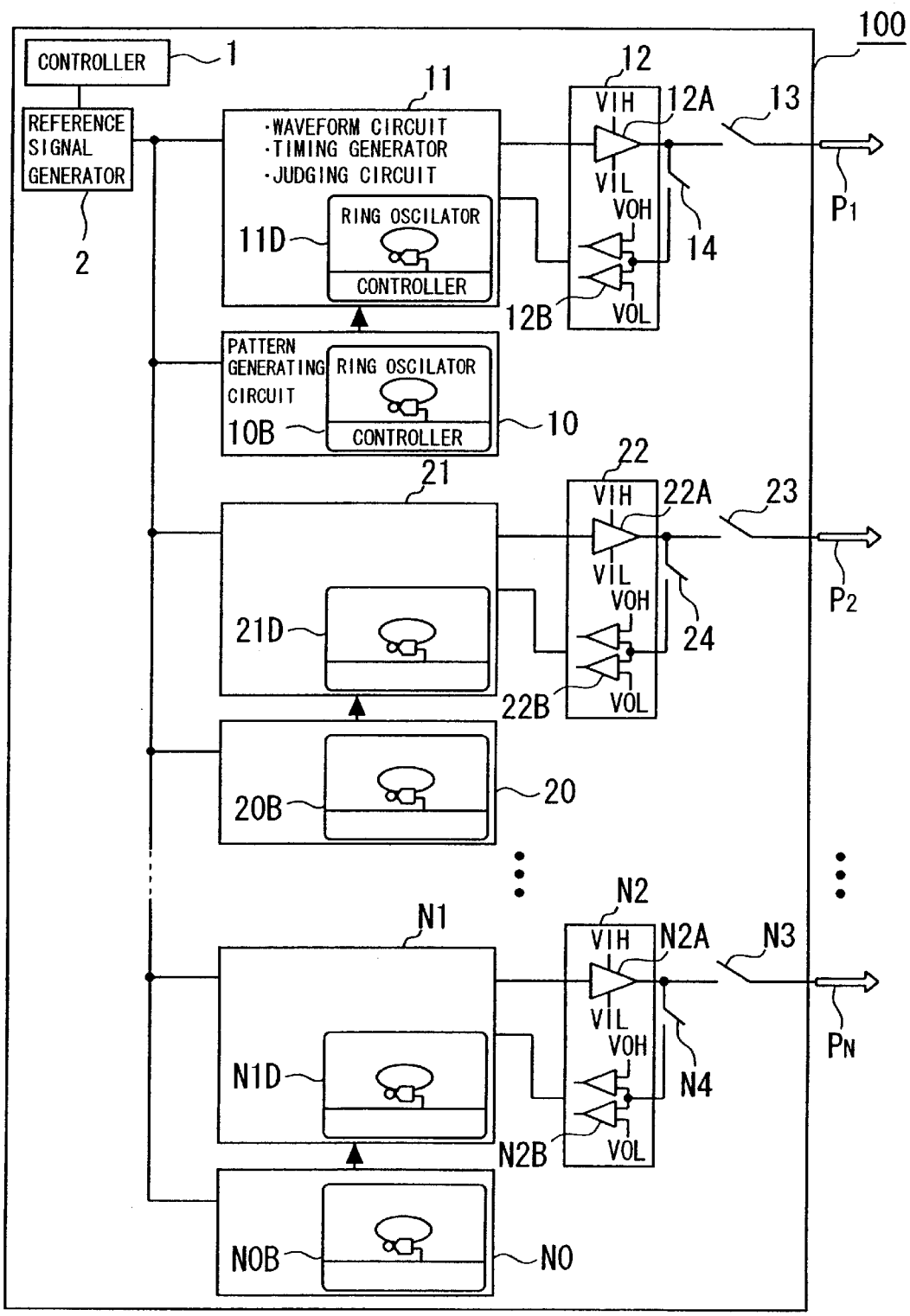
FIG. 5 is a block diagram of a fourth embodiment of the invention.

FIG. 5 is a block diagram of the fourth embodiment. In FIG. 5, the component parts having the same or corresponding functions as their counterparts in FIG. 1 are designated by like reference numerals, and their descriptions are omitted. The fourth embodiment differs from the first embodiment in FIG. 1 in that the clock mask function units are removed from the input sides of the pattern generating circuits 10, 20 and N0 as well as the main circuits 11, 21 and N1 and that each of the main and the pattern generating circuits incorporates a ring oscillating circuit and an oscillation control circuit. In FIG. 5, reference numeral 11D represents a ring oscillating circuit and oscillation control circuit used for warm-up purposes and included in the main circuit 11, and numeral 10B denotes a warm-up-use ring oscillating circuit and oscillation control circuit within the pattern generating circuit 10. These oscillation-related circuits are designed to warm up rapidly their host circuits when the changing of target LSIs under test requires, say, the currently unused first pin P1 to be used next. Likewise, reference numerals 21D and 20B stand for ring oscillating circuits and oscillation control circuits included respectively in the main circuit 21 and pattern generating circuit 20 regarding the second pin P2. Reference numerals N1D and N0B represent ring oscillating circuits and oscillation control circuits included respectively in the main circuit N1 and pattern generating circuit N0.

Figure 6:
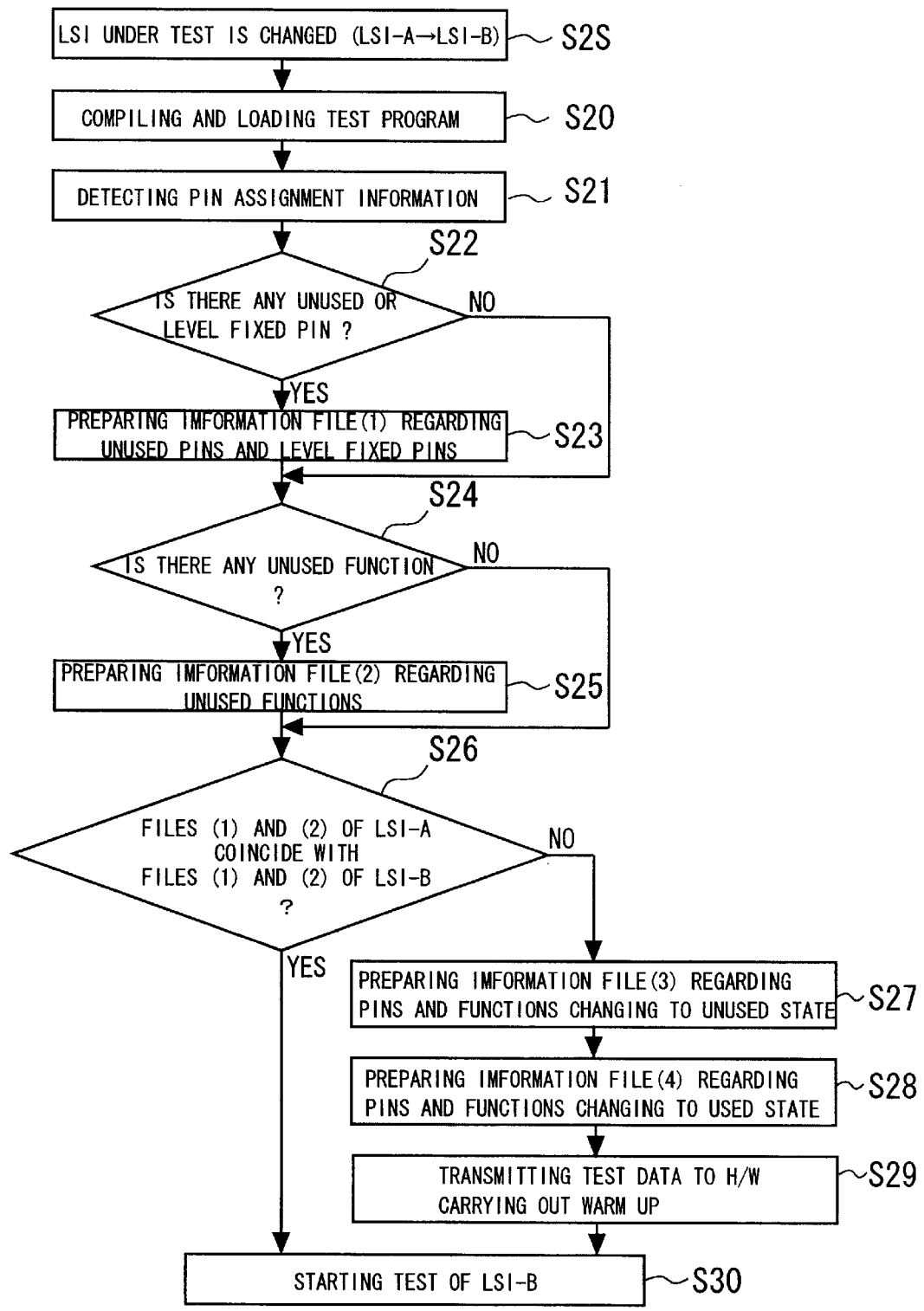
FIG. 6 is a flowchart of steps performed by the fourth embodiment.

How the fourth embodiment works will now be described with reference to the flowchart in FIG. 6.

The fourth embodiment is utilized when the LSI type to be tested is changed from LSI-A to LSI-B in step S2S. In step S20, a test program for the LSI-B is compiled and loaded. Steps S21 through S25 are the same as steps S11 through S15 in FIG. 2 and thus will not be described further.

Files of information about unused pins and functions regarding the LSI-B are prepared in up to step S25. These files are compared with similarly filed information about the LSI-A in step S26.

If the files of unused pin and function information on the LSI-A coincide with those on the LSI-B, then the power-saving feature set by the first through the third embodiments in testing the LSI-A is maintained, and step S30 is reached to test the LSI-B.

If the files of unused pin and function information on the LSI-A fail to coincide with those on the LSI-B, then steps S27 and S28 are reached. A file of information about pins and functions which were used for the LSI-A and which are to be put out of use for the LSI-B is prepared in step S27, and a file of information about pins and functions which were not used for the LSI-A and which are to be used for the LSI-B is prepared in step S28.

In step S29, the filed information is set to the hardware. More specifically, the file of information on the pins and functions previously used and about to be put out of use is set to the hardware so as to save power, as in the case of the first through the third embodiments; the file of information on the pins and functions previously out of use and about to be used is set to the hardware in order to rapidly warm up the relevant portions of hardware when they leave their power-saving mode to enter a used state. The LSI testing apparatus cannot maintain necessary levels of timing precision if its hardware is at a low temperature; the hardware must be warmed up to a level high enough to allow the apparatus to maintain its accuracy.

Illustratively, the ring oscillating circuits and oscillation control circuits 11D and 10B in the main circuit and pattern generating circuit 10 regarding the first pin P1 are operated to warm up the hardware relevant to the pins and functions making an unused to used state transition.

After the warm-up, the ring oscillating circuits and oscillation control circuits 11D and 10B are stopped. In step S30, the LSI-B is tested.

As described, when a different type of LSI is to replace the LSI currently under test, the filed information about the old and the new LSI types is used as a basis for detecting the pins and functions effecting an unused to used state transition so that necessary measures are smoothly taken for the upcoming tests.

Fifth Embodiment

A fifth embodiment of this invent ion will now be described with reference to some of the accompanying drawings.

Figure 7:
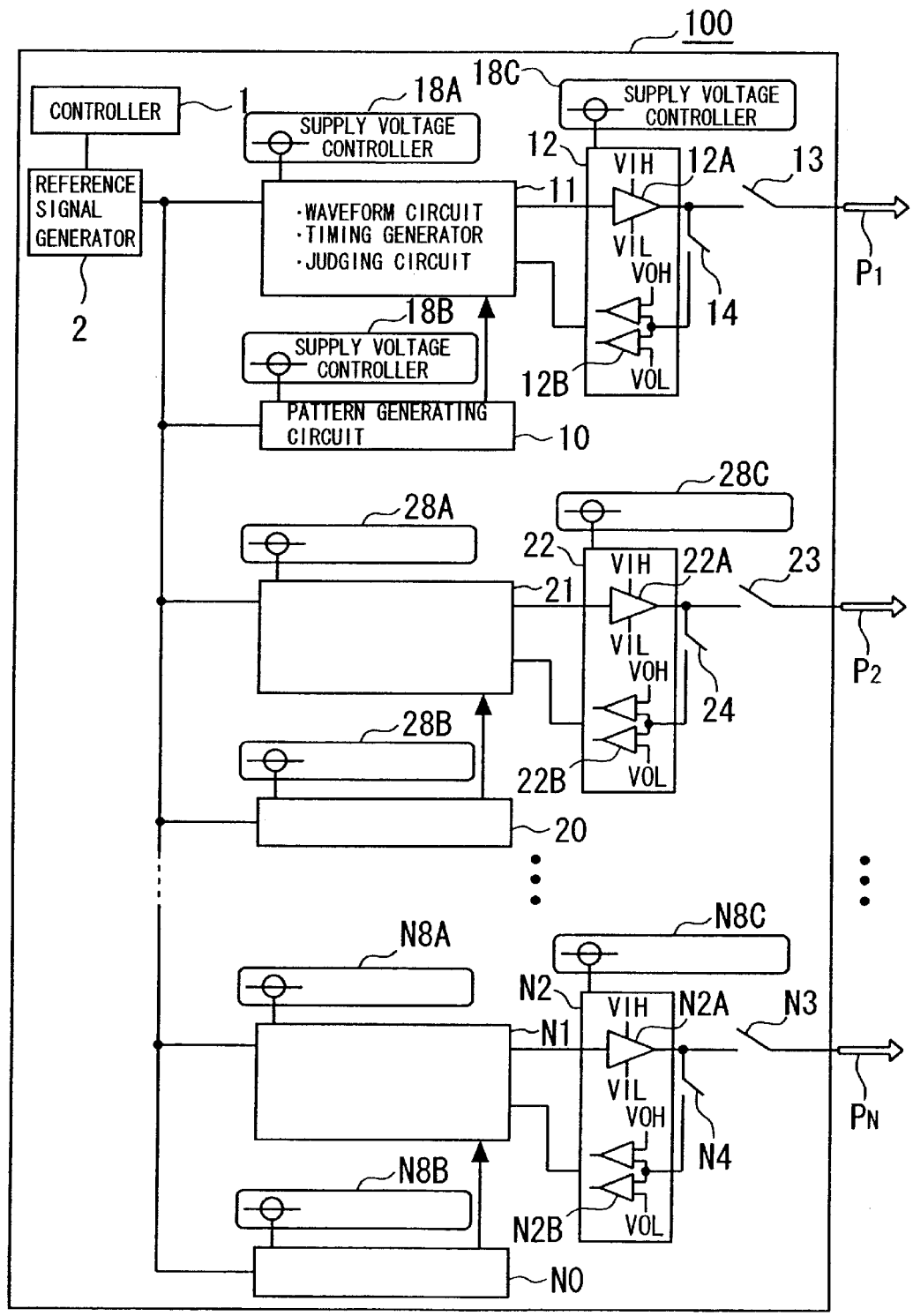
FIG. 7 is a block diagram of a fifth embodiment of the invention.

FIG. 7 is a block diagram of the fifth embodiment. In FIG. 7, the component parts having the same or corresponding functions as their counterparts in FIG. 3 are designated by like reference numerals, and their descriptions are omitted.

The fifth embodiment differs from the embodiment in FIG. 3 in that the power-on/off circuits are replaced by supply voltage control circuits.

In FIG. 7, reference numerals 18A, 18B and 18C denote supply voltage control circuits attached respectively to the main circuit 11, pattern generating circuit 10 and pin electronics circuit 12, i.e., function units with respect to the first pin P1. Each supply voltage control circuit is designed temporarily to boost the supply voltage for the corresponding host circuit, thereby increasing the quantity of heat generated by the host circuit for a rapid circuit temperature rise. This provides a speedy warm-up needed for the first pin P1 to make an unused to used state transition when the LSI currently under test is to be replaced by another type of LSI. Reference numerals 28A, 28B and 28C likewise represent supply voltage control circuits attached respectively to the main circuit 21, pattern generating circuit 20 and pin electronics circuit 22 regarding the second pin P2. Similarly, reference numerals N8A, N8B and N8C stand for supply voltage control circuits attached respectively to the main circuit N1, pattern generating circuit N0 and pin electronics circuit N2.

How the fifth embodiment works will now be described. Basic operations of the fifth embodiment are the same as those of the fourth embodiment in the flowchart of FIG. 6 and thus will not be described further. In step S29, the fifth embodiment causes illustratively the supply voltage control circuits 18A, 18B and 18C to boost temporarily the supply voltage to the main circuit 11, pattern generating circuit 10 and pin electronics circuit 12 with regard to the pin P1 that effects an unused to used state transition.

The LSI testing apparatus cannot maintain necessary levels of testing precision if its hardware is at a low temperature. Boosting the supply voltage increases the heating value of the relevant circuits. This makes it possible to warm up those portions of hardware which are relevant to the pins and functions effecting an unused to used state transition, the hardware temperature being raised to a sufficiently high level to maintain testing accuracy.

After the warm-up, the supply voltage is lowered to normal and the LSI-B is tested in step S30. The fifth embodiment is characterized by its ability instantaneously to warm up individual pins and functions through the use of a boosted supply voltage that raises the quantity of heat generated by the LSI for a hardware temperature increase. Thus when a different type of LSI is to replace the LSI currently under test, the filed information about the old and the new LSI types is used as a basis for detecting the pins and functions making an unused to used state transition so that necessary measures are smoothly taken for the upcoming tests.

Sixth Embodiment

A sixth embodiment of this invention will now be described with reference to some of the accompanying drawings.

Figure 8:
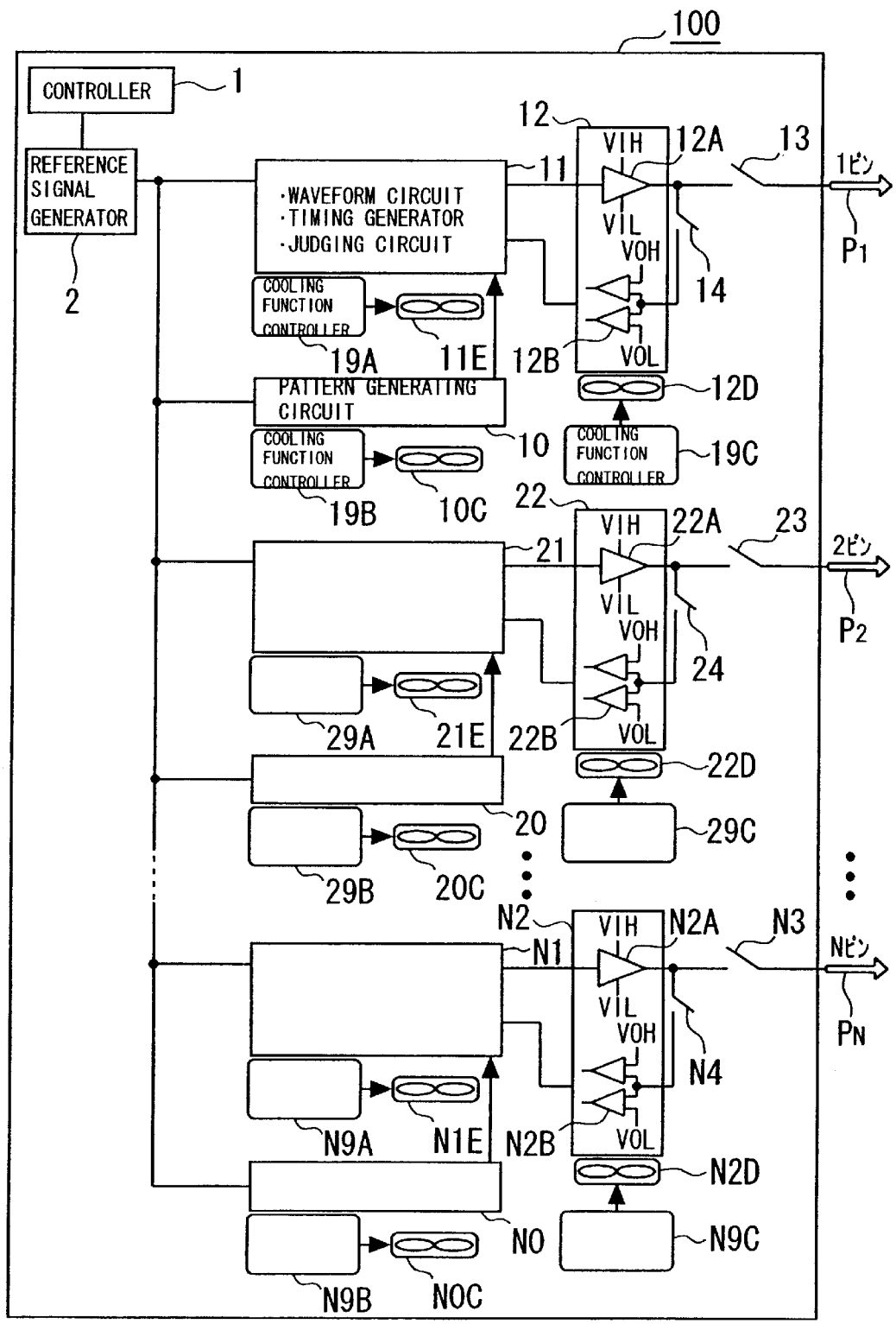
FIG. 8 is a block diagram of a sixth embodiment of the invention.

FIG. 8 is a block diagram of the sixth embodiment. In FIG. 8, the component parts having the same or corresponding functions as their counterparts in FIG. 7 are designated by like reference numerals, and their descriptions are omitted. The sixth embodiment differs from the embodiment in FIG. 7 in that the supply voltage control circuits are replaced by cooling function control circuits for controlling the operation of cooling fans attached to the main circuits, pattern generating circuits and pin electronics circuits. In FIG. 8, reference numerals 19A, 19B and 19C denote cooling function control circuits furnished respectively for the main circuit 11, pattern generating circuit 10, and pin electronics circuit 12, i.e., function units regarding the first pin P1. These cooling function control circuits are designed temporarily to stop cooling fans 11E, 10C and 12D attached respectively to the main circuit 11, pattern generating circuit 10, and pin electronics circuit 12, thereby rapidly raising the temperature of the function units regarding the first pin P1. This provides a speedy warm-up needed for the first pin P1 to make an unused to used state transition when the LSI currently under test is to be replaced by another type of LSI.

Reference numerals 29A, 29B and 29C likewise represent cooling function control circuits for controlling cooling fans 21E, 20C and 22D attached respectively to the main circuit 21, pattern generating circuit 20 and pin electronics circuit 22 regarding the second pin P2. Similarly, reference numerals N9A, N9B and N9C denote cooling function control circuits for controlling cooling fans N1E, N0C and N2D attached respectively to the main circuit N1, pattern generating circuit N0 and pin electronics circuit N2.

How the sixth embodiment works will now be described. Basic operations of the sixth embodiment are the same as those of the fourth embodiment in the flowchart of FIG. 6 and thus will not be described further. In step S29, the sixth embodiment causes illustratively the cooling function control circuits 19A, 19B and 19C to stop temporarily the cooling fans 11E, 10C and 12D attached respectively to the main circuit 11, pattern generating circuit 10 and pin electronics circuit 12 with regard to the pin P1 that effects an unused to used state transition. The stopped fans let the temperature of the relevant circuits rise.

The LSI testing apparatus cannot maintain necessary levels of timing precision if its hardware is at a low temperature. Temporarily stopping some of the cooling fans increases the temperature of the relevant circuits. This makes it possible to warm up those portions of hardware which are relevant to the pins and functions effecting an unused to used state transition, the hardware temperature being raised to a sufficiently high level to maintain timing accuracy.

After the warm-up, the cooling fans are again activated and the LSI-B is tested in step S30. By temporarily halting internal cooling functions of the LSI testing apparatus in units of pins and functions, the sixth embodiment instantaneously warms up individual pins and functions when a different type of LSI is to replace the LSI currently under test, so that necessary measures are smoothly taken for the upcoming tests.

Constituted as described, the LSI testing apparatus and testing method according to the invention are effective in reducing the running cost of testing diverse types of LSIs at the semiconductor factory. The inventive apparatus and method provide aging, at short notice, of the test-related hardware portions with regard to the pins and functions effecting an unused to used state transition when a different type of LSI is to replace the LSI currently under test.

Further, the present invention is not limited to these embodiments, but variations and modifications may be made without departing from the scope of the present invention.

The entire disclosure of Japanese Patent Application No. 2000-211907 filed on Jul. 12, 2000 including specification, claims, drawings and summary are incorporated herein by reference in its entirety.

What is claimed is:

1. An LSI testing apparatus comprising:
   a plurality of pins; and
   function units which supply said pins with LSI testing signals, which have functions for making judgments on tests, and which are furnished for each of said pins;
   wherein any unused pin and function are detected so as to stop the function unit corresponding to the detected pin and function.

2. The LSI testing apparatus according to claim 1, wherein the unused pin and function are detected by use of a test program.

3. An LSI testing apparatus comprising:
   a plurality of pins; and
   function units which supply said pins with LSI testing signals, which have functions for making judgments on tests, and which are furnished for each of said pins;
   wherein, upon testing, any pin and function having made an unused to used state transition are detected so as to warm up the function units corresponding to the detected pin and function.

4. The LSI testing apparatus according to claim 3, wherein the pin and function having made the unused to used state transition are detected by use of a test program.

5. The LSI testing apparatus according to claim 1, wherein each of said function units includes:
   a pattern generating circuit for generating a pin output pattern and a judgment pattern based on a reference signal of the testing apparatus;
   a main circuit for generating a timing signal based on pattern data from said pattern generating circuit and on said reference signal, said main circuit further generating waveforms and making judgments; and
   a pin electronics circuit which is connected interposingly between said main circuit and the corresponding pin and which has a driver and a comparator function.

6. The LSI testing apparatus according to claim 5, wherein said pattern generating circuit and said main circuit are each composed of CMOS devices in such a manner that the CMOS devices corresponding to any unused pin and function are deactivated.

7. The LSI testing apparatus according to claim 5, further comprising clock mask function units furnished on a reference signal input side of the pattern generating circuit and main circuit in each of said function units, wherein the clock mask function units corresponding to any unused pin and function are masked so as to reduce power dissipation.

8. The LSI testing apparatus according to claim 5, further comprising power-on/off circuits attached to the pattern generating circuit, main circuit and pin electronics circuit in each of said function units, wherein said power-on/off circuits are operated to turn off power to the pattern generating circuit, main circuit and pin electronics circuit corresponding to any unused pin and function.

9. The LSI testing apparatus according to claim 5, further comprising standby mode control circuits attached to the pattern generating circuit, main circuit and pin electronics circuit in each of said function units, wherein said standby mode control circuits are operated to bring into a standby mode either a memory or a field programmable gate array included in each of the pattern generating circuit, main circuit and pin electronics circuit corresponding to any unused pin and function.

10. The LSI testing apparatus according to claim 5, further comprising a ring oscillating circuit and an oscillation control circuit included in each of the pattern generating circuit and main circuit regarding each function unit, wherein said ring oscillating circuit and said oscillation control circuit are operated so as to warm up the function unit in question.

11. The LSI testing apparatus according to claim 5, further comprising a supply voltage control circuit included in each of the pattern generating circuit, main circuit, and pin electronics circuit regarding each function unit, wherein said supply voltage control circuit is operated to boost temporarily a supply voltage to the corresponding circuit in order to warm up the function unit in question.

12. The LSI testing apparatus according to claim 5, further comprising a cooling function control circuit included in each of the pattern generating circuit, main circuit, and pin electronics circuit regarding each function unit, wherein said cooling device control circuit is operated to stop temporarily a cooling device attached to each of said pattern generating circuit, said main circuit, and said pin electronics circuit in order to warm up the function unit in question.

13. The LSI testing apparatus according to claim 3, wherein each of said function units includes:
   a pattern generating circuit for generating a pin output pattern and a judgment pattern based on a reference signal of the testing apparatus;
   a main circuit for generating a timing signal based on pattern data from said pattern generating circuit and on said reference signal, said main circuit further generating waveforms and making judgments; and
   a pin electronics circuit which is connected interposingly between said main circuit and the corresponding pin and which has a driver and a comparator function.

14. The LSI testing apparatus according to claim 13, wherein said pattern generating circuit and said main circuit are each composed of CMOS devices in such a manner that the CMOS devices corresponding to any unused pin and function are deactivated.

15. The LSI testing apparatus according to claim 13, further comprising clock mask function units furnished on a reference signal input side of the pattern generating circuit and main circuit in each of said function units, wherein the clock mask function units corresponding to any unused pin and function are masked so as to reduce power dissipation.

16. The LSI testing apparatus according to claim 13, further comprising power-on/off circuits attached to the pattern generating circuit, main circuit and pin electronics circuit in each of said function units, wherein said power-on/off circuits are operated to turn off power to the pattern generating circuit, main circuit and pin electronics circuit corresponding to any unused pin and function.

17. The LSI testing apparatus according to claim 13, further comprising standby mode control circuits attached to the pattern generating circuit, main circuit and pin electronics circuit in each of said function units, wherein said standby mode control circuits are operated to bring into a standby mode either a memory or a field programmable gate array included in each of the pattern generating circuit, main circuit and pin electronics circuit corresponding to any unused pin and function.

18. The LSI testing apparatus according to claim 13, further comprising a ring oscillating circuit and an oscillation control circuit included in each of the pattern generating circuit and main circuit regarding each function unit, wherein said ring oscillating circuit and said oscillation control circuit are operated so as to warm up the function unit in question.

19. The LSI testing apparatus according to claim 13, further comprising a supply voltage control circuit included in each of the pattern generating circuit, main circuit, and pin electronics circuit regarding each function unit, wherein said supply voltage control circuit is operated to boost temporarily a supply voltage to the corresponding circuit in order to warm up the function unit in question.

20. The LSI testing apparatus according to claim 13, further comprising a cooling function control circuit included in each of the pattern generating circuit, main circuit, and pin electronics circuit regarding each function unit, wherein said cooling device control circuit is operated to stop temporarily a cooling device attached to each of said pattern generating circuit, said main circuit, and said pin electronics circuit in order to warm up the function unit in question.

* * * * *